United States Patent
Yoo et al.

(10) Patent No.: US 8,440,527 B2
(45) Date of Patent: May 14, 2013

(54) MEMORY DEVICE AND METHOD OF FABRICATING THE SAME

(75) Inventors: Dong-Chul Yoo, Seongnam-si (KR); Eun-Ha Lee, Seoul (KR); Hyung-Ik Lee, Suwon-si (KR); Ki-Hyun Hwang, Seongnam-si (KR); Sung Heo, Suwon-si (KR); Han-Mei Choi, Seoul (KR); Yong-Koo Kyoung, Seoul (KR); Byong-Ju Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 343 days.

(21) Appl. No.: 12/659,357

(22) Filed: Mar. 5, 2010

(65) Prior Publication Data

US 2011/0001183 A1 Jan. 6, 2011

(30) Foreign Application Priority Data

Mar. 6, 2009 (KR) .................. 10-2009-0019319
Mar. 26, 2009 (KR) .................. 10-2009-0025989

(51) Int. Cl.
*H01L 29/788* (2006.01)
*H01L 29/792* (2006.01)
*H01L 29/66* (2006.01)
*H01L 21/336* (2006.01)

(52) U.S. Cl.
USPC .... 438/261; 257/239; 257/321; 257/E29.309; 257/324; 438/288

(58) Field of Classification Search ........... 257/E21.209, 257/E29.309, 314–326; 438/261
See application file for complete search history.

(56) References Cited

U.S. PATENT DOCUMENTS

| | | | |
|---|---|---|---|
| 6,844,604 B2 | 1/2005 | Lee et al. | |
| 6,933,218 B1 | 8/2005 | Lee et al. | |
| 7,371,633 B2 | 5/2008 | Lee et al. | |
| 7,588,989 B2 | 9/2009 | Kim et al. | |
| 2002/0106536 A1* | 8/2002 | Lee et al. | 428/702 |
| 2007/0205419 A1* | 9/2007 | Ono et al. | 257/79 |
| 2007/0287261 A1* | 12/2007 | Raaijmakers et al. | 438/437 |
| 2009/0020802 A1* | 1/2009 | Ma et al. | 257/316 |
| 2009/0302365 A1* | 12/2009 | Bhattacharyya | 257/298 |

FOREIGN PATENT DOCUMENTS

| | | |
|---|---|---|
| JP | 2006-147896 A | 6/2006 |
| KR | 10-2003-0079400 A | 10/2003 |
| KR | 10-2004-0002818 A | 1/2004 |
| KR | 10-2006-0064971 A | 6/2006 |
| KR | 10-0762390 B1 | 10/2007 |

OTHER PUBLICATIONS

Rashed et al (Structure-property relationship in high-tension ceramic insulator fired at high temperature, 2003).*

* cited by examiner

*Primary Examiner* — Matthew Landau
*Assistant Examiner* — Khaja Ahmad
(74) *Attorney, Agent, or Firm* — Lee & Morse, P.C.

(57) ABSTRACT

A memory device and a method of fabricating the same are provided. The memory device includes a tunneling dielectric layer on a substrate, a charge storage layer on the tunneling dielectric layer, a blocking dielectric layer on the charge storage layer, the blocking dielectric layer including a first dielectric layer having silicon oxide, a second dielectric layer on the first dielectric layer and having aluminum silicate, and a third dielectric layer formed on the second dielectric layer and having aluminum oxide, and an upper electrode on the blocking dielectric layer.

19 Claims, 22 Drawing Sheets

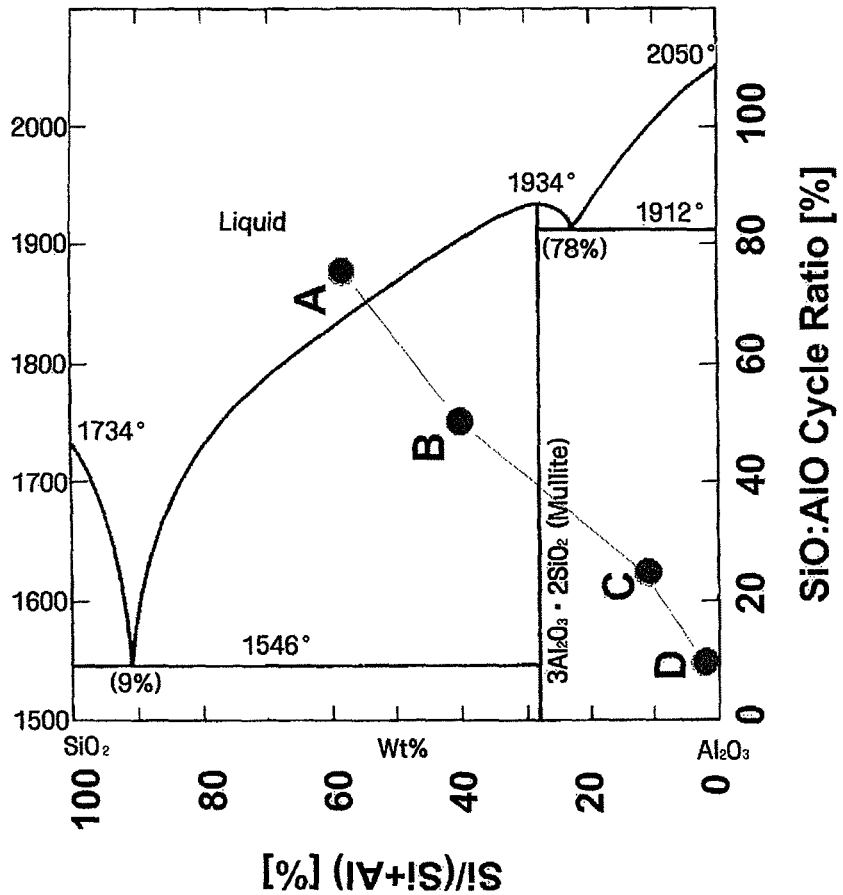

MEMORY DEVICE AND METHOD OF FABRICATING THE SAME

BACKGROUND

1. Field

Example embodiments relate to a memory device and a method of fabricating the same. More particularly, example embodiments relate to a memory device having an improved reliability and a method of fabricating the same.

2. Description of the Prior Art

A memory device has been diversely applied to an apparatus, such as a microcontroller, a credit card, and the like. As one of such memory device, a flash memory device has been developed.

For example, a flash memory device may include a charge trap type flash memory device or a floating gate type flash memory device. The charge trap type flash memory device may have a structure in which a tunneling dielectric layer, a charge trap layer, a blocking dielectric layer, and an upper electrode are sequentially formed on a semiconductor substrate. The floating gate type flash memory device may have a structure in which a tunneling dielectric layer, a floating gate, a blocking dielectric layer, and an upper electrode are sequentially formed on a semiconductor substrate. The charge trap layer (or the floating gate) is designed so that an operating voltage is applied from the upper electrode to the charge trap layer (or the floating gate) to produce an electric potential difference between the charge trap layer (or the floating gate) and the semiconductor substrate. Therefore, electrons are injected from the semiconductor substrate to the charge trap layer (or the floating gate) or electrons are emitted from the charge trap layer (or the floating gate) to the substrate.

Recently, with the integration of devices, dimensions of memory cells and peripheral circuits have been miniaturized, and due to such a tendency and energy efficiency, the operating voltage of a memory device has been lowered. In a flash memory device, charge inflow and maintenance is very important in controlling memory device signals and securing the reliability. Further, the properties and characteristics of dielectric layers, e.g., a tunneling dielectric layer and a blocking dielectric layer, play an important role in securing the reliability of a flash memory device.

SUMMARY

Embodiments are therefore directed to a memory device and a method of fabricating the same, which substantially overcome one or more of the problems due to the limitations and disadvantages of the related art.

It is therefore a feature of an embodiment to provide a flash memory device having improved device characteristics and reliability.

It is therefore another feature of an embodiment to provide a method of fabricating a flash memory device having improved device characteristics and reliability.

At least one of the above and other features and advantages may be realized by providing a memory device, including a tunneling dielectric layer formed on a substrate, a charge storage layer formed on the tunneling dielectric layer, a blocking dielectric layer formed on the charge storage layer, the blocking dielectric layer including a first dielectric layer having silicon oxide, a second dielectric layer formed on the first dielectric layer and having aluminum silicate, and a third dielectric layer formed on the second dielectric layer and having aluminum oxide, and an upper electrode formed on the blocking dielectric layer.

The aluminum silicate in the second dielectric layer may be mullite. The aluminum silicate in the second dielectric layer may include a phase of aluminum oxide and silicon oxide, a weight ratio of the aluminum oxide to a sum of the aluminum oxide and silicon oxide being about 60% to about 95%. The weight ratio of the aluminum oxide to the sum of the aluminum oxide and silicon oxide may be about 70% to about 90%. The second dielectric layer may be between the first dielectric layer and the third dielectric layer. A thickness of the second dielectric layer may be equal to or larger than a thickness of the first dielectric layer. The second dielectric layer may be thinner than the third dielectric layer. The second dielectric layer may include crystallized mullite. The mullite may exhibit substantially uniform crystallization in an entire thickness of the second dielectric layer. The charge storage layer may include one or more of silicon nitride, hafnium oxide, zirconium oxide, tantalum oxide, hafnium nitride oxide, hafnium silicon oxide, tungsten doped aluminum oxide, and nanodots.

At least one of the above and other features and advantages may also be realized by providing a method of fabricating a memory device, including forming a tunneling dielectric layer on a substrate; forming a charge storage layer on the tunneling dielectric layer; and forming a blocking dielectric layer on the charge storage layer; wherein forming the blocking dielectric layer includes forming a first dielectric layer having silicon oxide on the charge storage layer, forming a second dielectric layer having aluminum silicate on the first dielectric layer, and forming a third dielectric layer having aluminum oxide on the second dielectric layer.

The second dielectric layer may be formed using an atomic layer deposition (ALD) method. The second dielectric layer may be formed by an in-situ process. The second dielectric layer may be formed to have a weight ratio of aluminum oxide to aluminum silicate of about 70% to about 90%. The method may further include thermal treatment of the second dielectric layer at about 850° C. to about 1200° C.

BRIEF DESCRIPTION OF THE DRAWINGS

The above and other objects, features and advantages will be more apparent from the following detailed description taken in conjunction with the accompanying drawings, in which:

FIGS. 6 to 12B illustrate graphs and diagrams explaining results of experimental examples.

DETAILED DESCRIPTION

Figure 1:
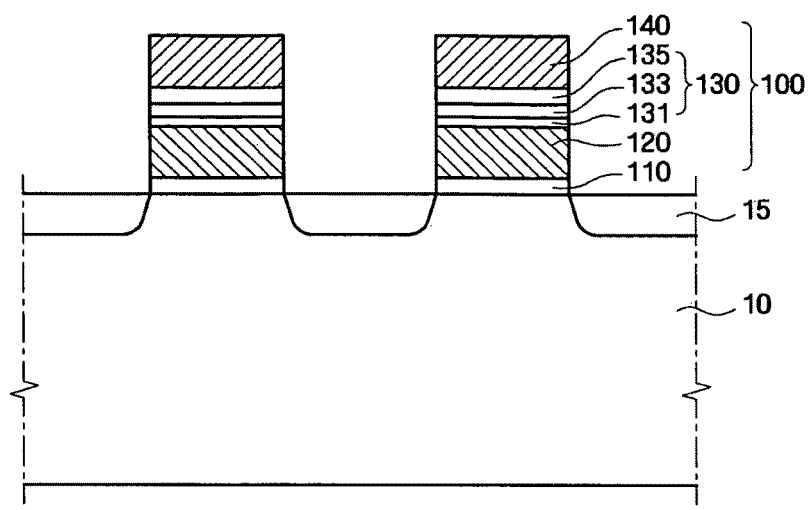
FIG. 1 illustrates a cross-sectional view of a memory device according to an embodiment.

Korean Patent Application No. 10-2009-0019319, filed on Mar. 6, 2009, and No. 10-2009-0025989, filed on Mar. 26, 2009, in the Korean Intellectual Property Office, and entitled: "Memory Device and Method of Fabricating the Same," are incorporated by reference herein in their entirety.

Hereinafter, preferred embodiments will be described in detail with reference to the accompanying drawings. However, embodiments are not limited to the embodiments disclosed hereinafter, but can be implemented in diverse forms. The matters defined in the description, such as the detailed construction and elements, are nothing but specific details provided to assist those of ordinary skill in the art in a comprehensive understanding of the embodiments, and the embodiments are only defined within the scope of the appended claims.

All terms (including technical and scientific terms) used in the description could be used as meanings commonly understood by those ordinary skilled in the art to which embodiments belongs. The term "connected to" or "coupled to" that is used to designate a connection or coupling of one element to another element includes both a case that an element is "directly connected or coupled to" another element and a case that an element is connected or coupled to another element via still another element. In this case, the term "directly connected to" or "directly coupled to" means that an element is connected or coupled to another element without intervention of any other element. Similarly, it will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

The term "comprises" and/or "made of" used in the description means that one or more other components, steps, operation and/or existence or addition of elements are not excluded in addition to the described components, steps, operation and/or elements. Also, the term "and/or" includes the respective described items and combinations thereof In the description, a singular expression may include a plural expression unless specially described.

Although the terms "first, second, and so forth" are used to describe diverse elements, components and/or sections, such elements, components and/or sections are not limited by the terms. The terms are used only to discriminate an element, component, or section from other elements, components, or sections. Accordingly, in the following description, a first element, first component, or first section may be a second element, second component, or second section.

In the following description, the terms used are for explaining embodiments, but do not limit the scope thereof. For example, the spatially relative terms "below", "beneath", "lower", "above", "upper", and so forth, as illustrated in the drawings, may be used to facilitate the description of relationships between an element or constituent elements and another element or other constituent element. The spatially relative terms should be understood as terms that include different directions of the element in use or operation in addition to the direction illustrated in the drawings. Since the drawings included in the specification are to clearly present the constituent elements and features of the invention, sizes and relative sizes of layers and areas illustrated in the drawings may be exaggerated for clarity in explanation.

Figure 2A:
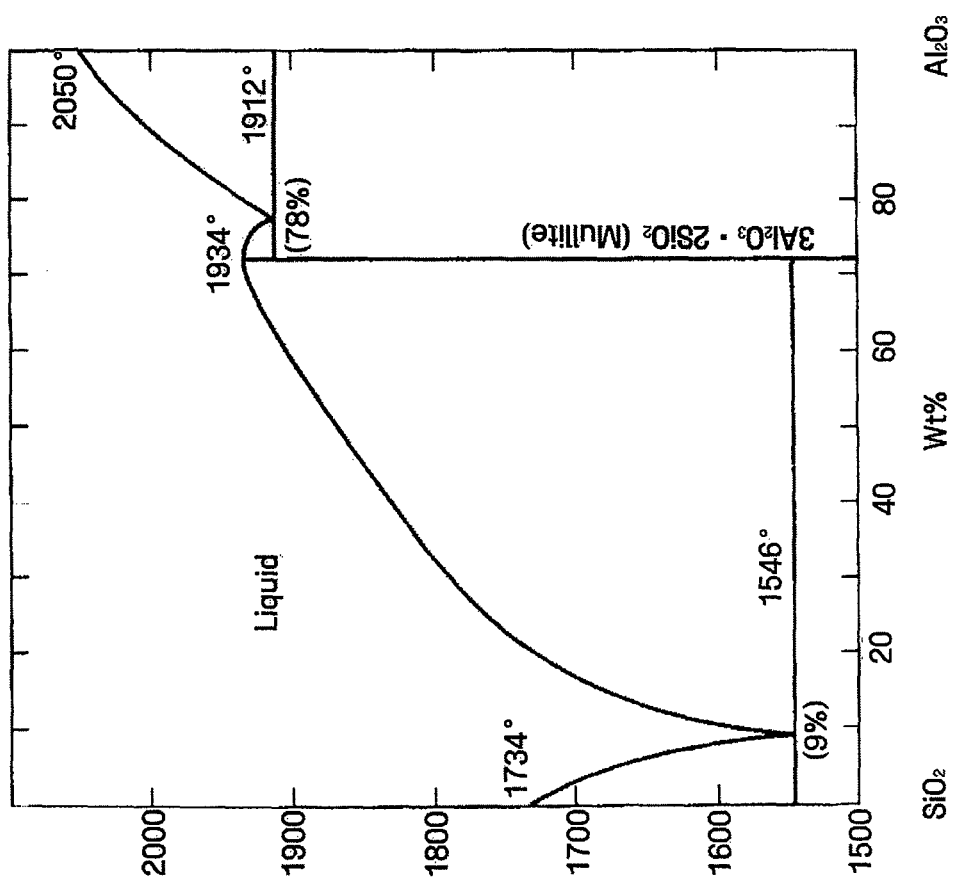
FIG. 2A illustrates a phase state diagram of aluminum oxide and silicon oxide.
Figure 2B:
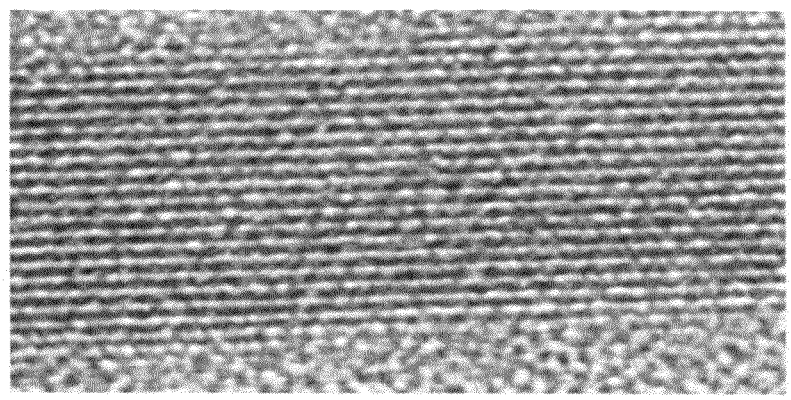
FIG. 2B illustrates an enlarged photograph of crystallized mullite.

Preferred embodiments will be described hereinafter with reference to the accompanying FIGS. 1-2B. FIG. 1 illustrates a cross-sectional view of a memory device according to an embodiment. FIG. 2A illustrates a phase state diagram of aluminum oxide and silicon oxide, and FIG. 2B illustrates a photograph of crystallized mullite.

Referring to FIG. 1, a gate structure 100 may be formed on a substrate 10. The substrate 10 may be a semiconductor substrate. For example, the substrate 100 may be a silicon substrate, a silicon on insulator (SOI) substrate, a germanium substrate, a germanium on insulator (GOI) substrate, a silicon germanium substrate, a gallium arsenide substrate, an epitaxial substrate formed by performing a selective epitaxial growth (SEG), and the like. Although not illustrated in the drawing, the substrate 10 may include an element isolation region for defining an active region.

In the substrate 10, source/drain regions 15 may be formed to be spaced apart from each other. The source/drain regions 15 may be doped with conductive impurities of a doping type opposite to that of the substrate, i.e., p-type or n-type impurities, and a channel region may be formed between a pair of source/drain regions 15 facing each other. Although not illustrated in the drawing, the source/drain regions 15 may have a double diffused drain (DDD) or a lightly doped drain (LDD) structure.

The gate structure 100 corresponds to a memory cell in a flash memory device. The gate structure 100 may include a tunneling dielectric layer 110, a charge storage layer 120, a blocking dielectric layer 130, and an upper electrode 140.

The tunneling dielectric layer 110 may be formed on the substrate 10 to provide an energy barrier according to tunneling of electric charge. The tunneling dielectric layer 110 may include, e.g., silicon oxide, silicon nitride, or high-k material. Here, the high-k material may include, but is not limited to, metal oxide, e.g., hafnium oxide, aluminum oxide, hafnium aluminum oxide, and zirconium oxide. For example, the tunneling dielectric layer 110 may be formed of diverse materials in consideration of not only a dielectric constant but also an energy band gap property.

The charge storage layer 120 may be formed on the tunneling dielectric layer 110, and may store electric charges. Here, if the flash memory device is of a charge trap type, the charge storage layer may be a charge trap layer, while if the flash memory device is of a floating gate type, the charge storage layer may be a floating gate.

For example, if the charge storage layer 120 is a charge trap layer, a plurality of trap sites that can trap electric charges may exist in the charge storage layer 120, and thus, electrons may be stored therein. The charge storage layer 120 may include, e.g., silicon nitride, hafnium oxide, zirconium oxide, tantalum oxide, hafnium nitride oxide, hafnium silicon oxide, tungsten doped aluminum oxide, nanodots, and the like. If the charge storage layer 120 is a floating gate, the charge storage layer 120 may be formed of a conductive material, e.g., polysilicon.

The blocking dielectric layer 130 may be formed on, e.g., directly on, the charge storage layer 120, and may serve to prevent the electric charge stored in the charge storage layer 120 from emitting to the upper electrode 140 or to prevent the electric charge from being injected from the upper electrode 140 to the charge storage layer 120. As illustrated in FIG. 1, the blocking dielectric layer 130 may be formed of a multi-layer dielectric layer including first, second, and third dielectric layers 131, 133, and 135, respectively.

The first dielectric layer 131 may be formed on, e.g., directly on, the charge storage layer 120, and may include silicon oxide. The first dielectric layer 131 including silicon oxide may have a high energy band gap against the electric charge, and thus, may efficiently prevent the electric charge from moving between the charge storage layer 120 and the upper electrode 140.

Further, the first dielectric layer 131 may prevent diffusion into the charge storage layer 120. For example, if a high-k layer, e.g., the third dielectric layer 135 including aluminum oxide, is formed on the first dielectric layer 131, the first dielectric layer 131 may prevent diffusion, e.g., of aluminum metal, from the high-k layer to the charge storage layer 120. In another example, surplus aluminum oxide or aluminum metal, i.e., extracted from the second dielectric layer 133 that includes aluminum silicate and is on the first dielectric layer 131, may be prevented from being diffused from the second dielectric layer 133 to the charge storage layer 120.

The first dielectric layer 131 may have a thickness of about 15 angstroms to about 40 angstroms. A thickness of about 15 angstroms or higher may prevent or substantially minimize diffusion, e.g., diffusion of aluminum into the charge storage layer 120, and a thickness of about 40 angstroms or less may reduce equivalent oxide thickness (EOT) of the blocking dielectric layer 130.

The second dielectric layer 133 may be formed between, e.g., directly between, the first dielectric layer 131 and the third dielectric layer 135, and may include aluminum silicate. For example, the aluminum silicate may be mullite. In detail, the weight content of aluminum oxide (Al) in the aluminum silicate of the second dielectric layer 133, i.e., a weight ratio of the aluminum oxide relative to a total weight of aluminum oxide and silicon oxide (hereinafter referred to as "Al/(Al+Si"), may be about 60% to about 95%, e.g., about 70% to about 90%, in order for the second dielectric layer 133 to include mullite, e.g., crystallized mullite.

If Al/(Al+Si) is less than about 60%, the content of Al may be relatively small, so even if the second dielectric layer 133 is treated with heat, mullite or crystallized mullite may not be formed in the second dielectric layer 133. If Al/(Al+Si) is more than about 95%, the content of Al is relatively large, so even if the second dielectric layer 133 is treated with heat, the mullite or the crystallized mullite may not be formed in the second dielectric layer 133. Also, if Al/(Al+Si) is more than about 60% but less than about 70%, the mullite or the crystallized mullite may be prone to be formed in the second dielectric layer 133, e.g., with non-uniform crystallization. Similarly, if Al/(Al+Si) is more than about 90% but less than about 95%, the mullite or the crystallized mullite may be prone to be formed in the second dielectric layer 133 with non-uniform crystallization, e.g., aluminum metal may potentially diffuse to the first dielectric layer 131 or the charge storage layer 120 to reduce quality of the second dielectric layer 133. Accordingly, in an embodiment, the ratio Al/(Al+Si) may preferably be about 70% to about 90%. This will be described in detail below in the experimental example 1 with reference to FIGS. 6 to 10B.

As illustrated in FIG. 2A, mullite is a phase of aluminum silicate that is formed in a specific composition ratio of aluminum oxide and silicon oxide (specifically, formula weight ratio of 3:2, $3Al_2O_3 \cdot 2SiO_2$), and is thermally stable in comparison to other aluminum silicate phases having a melting point of about 1820° C. Mullite, for example, may be thermally more stable in comparison to an aluminum silicate formed on an interface between a silicon oxide layer and an aluminum oxide layer, e.g., as silicon or aluminum atoms diffuse from one layer into an under/overlying layer in the process of forming an aluminum oxide layer on a silicon oxide layer. As illustrated in FIG. 2B, mullite may be easily crystallized to become a more thermally stable phase, thereby strengthening the bonding of aluminum and silicon atoms therein. If the bonding between aluminum and silicon atoms is strengthened in the second dielectric layer 133 according to an embodiment, the second dielectric layer 133 may effectively prevent aluminum oxide of the third dielectric layer 135 from diffusing into the first dielectric layer 131 in the process of forming the third dielectric layer 135 or in the process of performing a thermal treatment on the third dielectric layer 135.

Also, since the second dielectric layer 133 including aluminum silicate is interposed between the first dielectric layer 131 including silicon oxide and the third dielectric layer 135 including aluminum oxide, the band gap of the blocking dielectric layer 130 may be more efficiently adjusted. That is, the interface characteristics may be improved by gradually changing the composition of aluminum and silicon even if no interface exists or the interface exists among the respective layers 131, 133, and 135 of the blocking dielectric layer 130.

Further, if the second dielectric layer 133 is aluminum silicate, and specifically mullite, crystallization may be easily performed in comparison to aluminum silicate that is formed by the diffusion of the aluminum component or the silicon component in the interface between the silicon oxide layer and the aluminum oxide layer. Accordingly, a crystallized second dielectric layer 133 may suppress the direct interface reaction between the silicon oxide included in the first dielectric layer 131 and aluminum oxide included in the third dielectric layer 135, and may reduce leakage current in the blocking dielectric layer 130.

The thickness of the second dielectric layer 133 may be, e.g., about 30 angstroms to about 70 angstroms. A thickness of about 30 angstroms or higher may facilitate the crystallization of aluminum silicate, and a thickness of about 70 angstroms or less may reduce the EOT of the blocking dielectric layer 130.

The third dielectric layer 135 may be formed on the second dielectric layer 133, and may include aluminum oxide. Since the third dielectric layer 135 including aluminum oxide has a relatively high dielectric constant in comparison to the first dielectric layer 131 including silicon oxide, the EOT of the blocking dielectric layer 130 may be reduced. Accordingly, even if the same voltage is applied to the upper electrode 140, the voltage transferred to the tunneling dielectric layer 110 may be increased, and thus, the operation voltage of the memory device may be reduced. The thickness of the third dielectric layer 135 may be about 30 angstroms to about 80 angstroms. A thickness of about 30 angstroms or more may efficiently prevent the back tunneling of the electric charge from the upper electrode 140 to the charge storage layer 120, and a thickness of about 80 angstroms or less may reduce the EOT of the blocking dielectric layer 130.

In an embodiment, the thickness of the second dielectric layer 133 in the blocking dielectric layer 130 may be larger than the thickness of the first dielectric layer 131. That is, the thickness of the second dielectric layer 133 including aluminum silicate having a relatively higher dielectric constant may be larger than the thickness of the first dielectric layer 131 including silicon oxide having a relatively smaller dielectric constant. Also, the thickness of the third dielectric layer 135 in the blocking dielectric layer 130 may be larger than the thickness of the second dielectric layer 133. That is, the thickness of the third dielectric layer 135 including aluminum oxide having a relatively higher dielectric constant may be larger than the thickness of the second dielectric layer 133 including silicon silicate having a relatively smaller dielectric constant. Accordingly, the EOT of the blocking dielectric layer 130 may be reduced.

Unlike this, for example, if the thickness of the first dielectric layer 131 is substantially equal to or larger than the thickness of the second dielectric layer 133, diffusion of the aluminum component to the charge storage layer 120 may be prevented more effectively. Therefore, thickness of the second dielectric layer 133 relative to the first dielectric layer 131 may be adjusted.

The upper electrode 140 may be formed on the blocking dielectric layer 130, e.g., directly on the third dielectric layer 135. The upper electrode 140 may be formed of, e.g., polysilicon, or may be formed of a metal, e.g., one or more of TaN, TiN, WN, and W. Although not illustrated in the drawing, the upper electrode 140 may be connected to metal lines formed on the substrate 10 through a contact hole.

Hereinafter, operation of the memory device of FIG. 1 will be briefly described.

In the case of programming data, e.g., a ground voltage is applied to the substrate 10 and a positive voltage is applied to the upper electrode 140. Accordingly, an electrical field is formed between the substrate 10 and the upper electrode 140, and thus electric charge located in a channel region can be injected into the charge storage layer 120 through the tunneling dielectric layer 110. Also, movement of the electric charge, which is stored in the charge storage layer 120, to the upper electrode 140 is intercepted by the energy band gap of the blocking dielectric layer 130, so the electric charge is trapped in the charge storage layer 120. Accordingly, the data can be programmed.

In the case of deleting data, e.g., a ground voltage is applied to the substrate 10 and a negative voltage is applied to the upper electrode 140. In this case, an electrical field which is different from that in the case of programming data is formed between the substrate 10 and the upper electrode 140, and the electrical charge trapped in the charge storage layer 120 can be emitted to the channel region through the tunneling dielectric layer 110.

Particularly, in the memory device according to an embodiment, since the dielectric constant of the blocking dielectric layer 130 is high and the positive voltage or the negative voltage applied to the upper electrode 140 can be transferred to the tunneling dielectric layer 110 with almost no loss, the operation voltage of the memory device can be lowered. Also, by using the second dielectric layer 133 including aluminum silicate, characteristics of the interface between the first dielectric layer 131 including silicon oxide and the third dielectric layer 135 including aluminum oxide may be improved, and leakage current may be reduced. Accordingly, the blocking dielectric layer 130 may exhibit improved efficiency in blocking movement of the electric charge between the charge storage layer 120 and the upper electrode 140, so reliability of the memory device may be improved.

Hereinafter, with reference to FIGS. 3A to 3F, a method of fabricating a semiconductor device according to an embodiment will be described. FIGS. 3A to 3F illustrate cross-sectional views of intermediate process structures in a method of fabricating a semiconductor device according to an embodiment.

Figure 3A:
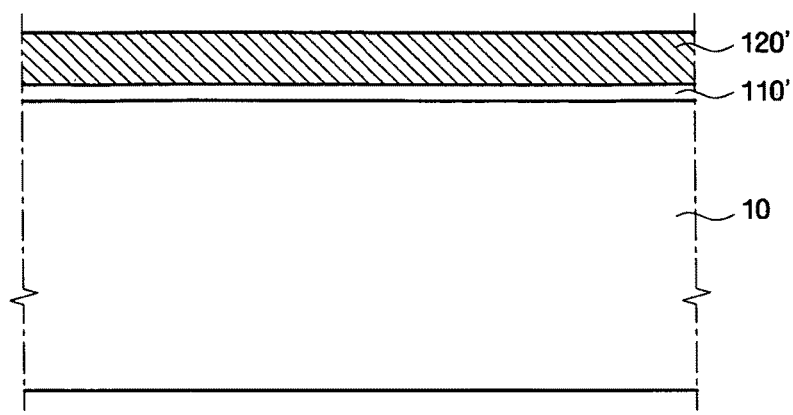
FIGS. 3A to 3F illustrate cross-sectional views of intermediate process structures in a method of fabricating a memory device according to an embodiment.

Referring to FIG. 3A, a plurality of active regions may be defined by forming an element isolation region (not illustrated) in the substrate 10. Then, a tunneling dielectric layer 110' and a charge trap layer 120' may be sequentially laminated and formed on the substrate 10 that includes the element isolation region. Here, the tunneling dielectric layer 110' may be formed by thermal oxidization of the substrate 10, e.g., using an in-situ stream process. And the charge trap layer 120' may be formed by depositing, e.g., silicon nitride, on the tunneling dielectric layer 110'.

Figure 3B:
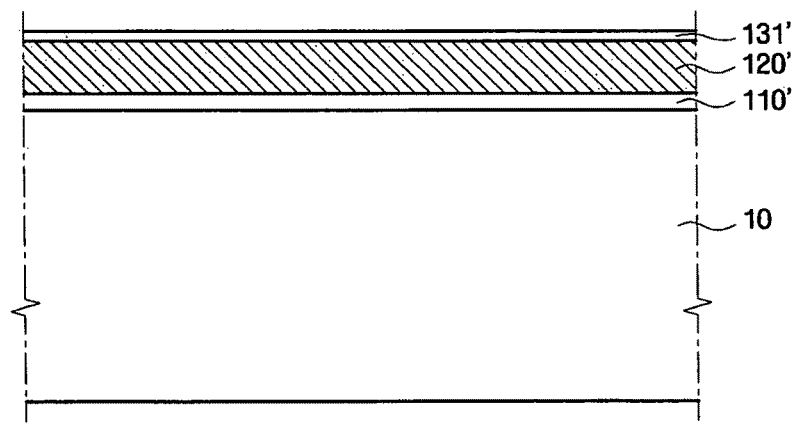

Referring to FIG. 3B, a first dielectric layer 131' may be formed on the charge trap layer 120'. The first dielectric layer 131' may be formed by depositing silicon oxide on the charge trap layer 120' using, e.g., CVD (Chemical Vapor Deposition), PECVD (Plasma Enhanced CVD), PVD (Physical Vapor Deposition), ALD (Atomic Layer Deposition), PEALD (Plasma Enhanced ALD), or the like.

Figure 3C:
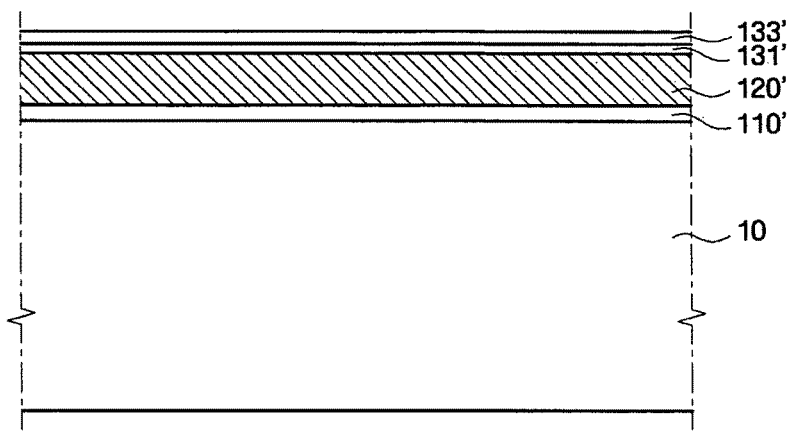

Then, referring to FIG. 3C, on the first dielectric layer 131', a second dielectric layer 133' including aluminum silicate may be formed. Hereinafter, the forming of the second dielectric layer 133' by in-situ using ALD will be described as an example.

First, the substrate 10 on which the first dielectric layer 131' is formed is placed in a chamber. Then, by supplying a silicon precursor material into the chamber, after adjusting a proper temperature and pressure, the silicon precursor may be adsorbed onto the first dielectric layer 131'. Here, the silicon precursor material may be, e.g., TEOS (Tetraethyl Ortho Silicon), TMS (Tetramethyl Silicon), TES (TetraEthyl Silicon), TDMAS (TetraDiMethylAmino Silicon), TEMAS (Tetra EthylMethylAmino Silicon), BTBAS (Bis(Tert_ButylAmino)Silane, or the like. Then, the precursor remaining in the chamber may be removed by supplying a purge gas, e.g. $N_2$, He, or Ar gas, into the chamber.

Then, an oxide gas may be supplied into the chamber. The oxide gas refers to a gas having an oxidation degree sufficient to oxidize the silicon precursor on the first dielectric layer 131'. The oxide gas may be, e.g., $O_2$, $O_3$, $H_2O$, NO, $NO_2$, $N_2O$, and the like. When the oxide gas is supplied, the silicon precursor adsorbed onto the first dielectric layer 131' may be oxidized to form silicon oxide. Then, the oxide gas remaining in the chamber may be removed by supplying a purge gas, e.g. $N_2$, He, or Ar gas, into the chamber.

By repeating the above-described cycles, i.e., supplying of a silicon precursor and oxidation thereof, silicon oxide may be formed on the first dielectric layer 131' to a predetermined thickness.

Then, an aluminum precursor material may be supplied into the chamber. Here, the aluminum precursor material may be, e.g., TMA (Tri Methyl Aluminum), DMAH (Di Methyl Aluminum Hydride), DMAH-EPP (DiMethyl Aluminum Hydride Ethyl Piperidine), and the like. The aluminum precursor may be adsorbed onto the silicon oxide.

Then, the precursor remaining in the chamber may be removed by supplying a purge gas, e.g. $N_2$, He, or Ar, into the chamber, and then aluminum oxide may be formed by supplying oxide gas into the chamber. Then, the oxide gas remaining in the chamber may be removed by supplying the purge gas, e.g. $N_2$, He, or Ar, into the chamber.

By repeating the above-described cycles, aluminum oxide may be formed on the silicon oxide to a predetermined thickness.

Here, when the second dielectric layer 133' is formed, the second dielectric layer 133' including mullite may be formed by changing the frequency of a processing cycle for forming the silicon oxide and a processing cycle for forming the aluminum oxide. That is, by changing the ratio of a process cycle for forming the silicon oxide to a processing cycle for forming the aluminum oxide (hereinafter referred to as "$SiO_2/Al_2O_3$ processing cycle ratio"), the second dielectric layer 133' may be formed to have Al/(Al+Si) of about 60% to about 95%, e.g., about 70% to about 90%. This will be described in more detail below in the experimental example 1 with reference to FIGS. 6 to 10B.

Then, thermal treatment may be performed on the second dielectric layer 133' to crystallize the aluminum silicate, i.e., the mullite, therein. The thermal treatment temperature for crystallizing the second dielectric layer 133' may be, e.g., about 850° C. to about 1200° C. If the thermal treatment temperature is lower than about 850° C., the mullite may not be crystallized in the second dielectric layer 133', while if the thermal treatment temperature is higher than about 1200° C., the quality of the second dielectric layer 133' may deteriorate.

Figure 3D:
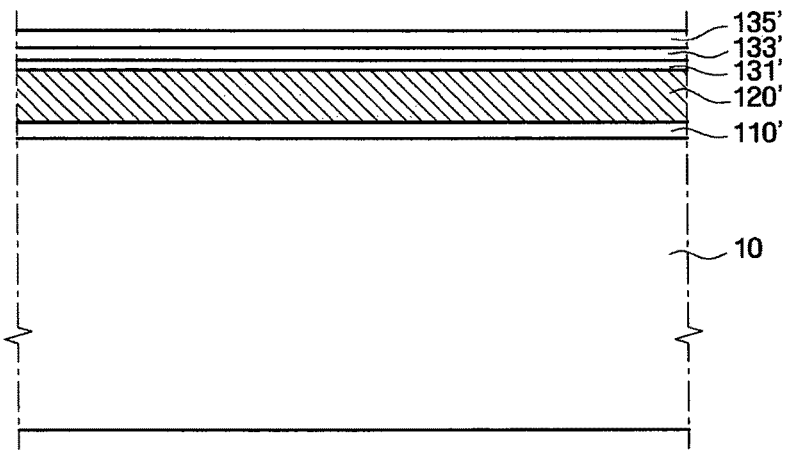

Then, referring to FIG. 3D, a third dielectric layer 135' may be formed on the second dielectric layer 133'. The third dielectric layer 135' may be formed by depositing aluminum oxide on the electron trap layer 120' using, e.g., CVD, PECVD, PVD, ALD, PEALD, or the like. Then, the aluminum oxide may be crystallized by performing thermal treatment of the third dielectric layer 135'.

Figure 3E:
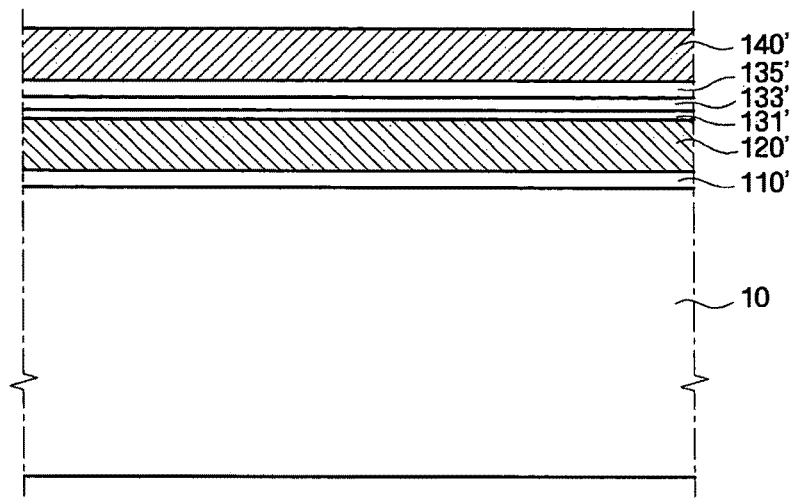

Referring to FIG. 3E, an upper electrode layer 140' may be formed on the third dielectric layer 135'. The upper electrode layer 140' may be formed of, e.g., polysilicon, or may be formed of a metal, e.g., one or more of TaN, TiN, WN, and W.

Figure 3F:
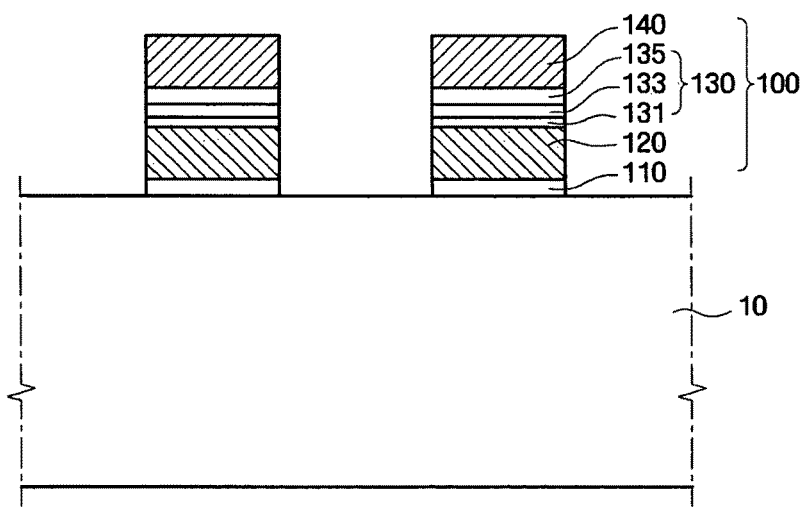

Then, referring to FIG. 3F, a mask pattern (not illustrated) may be formed on the upper electrode layer 140', and the gate structure 100 may be formed using the mask pattern. Specifically, using the mask pattern formed on the upper electrode layer 140', the gate structure 100 including the tunneling dielectric layer 110, the charge storage layer 120, the blocking dielectric layer 130, and the upper electrode 140 may be completed. Then, as shown in FIG. 1, by injecting impurity ions onto the substrate 10, the source/drain region 15 may be formed in the substrate 10 adjacent the gate structure 100.

Figure 4A:
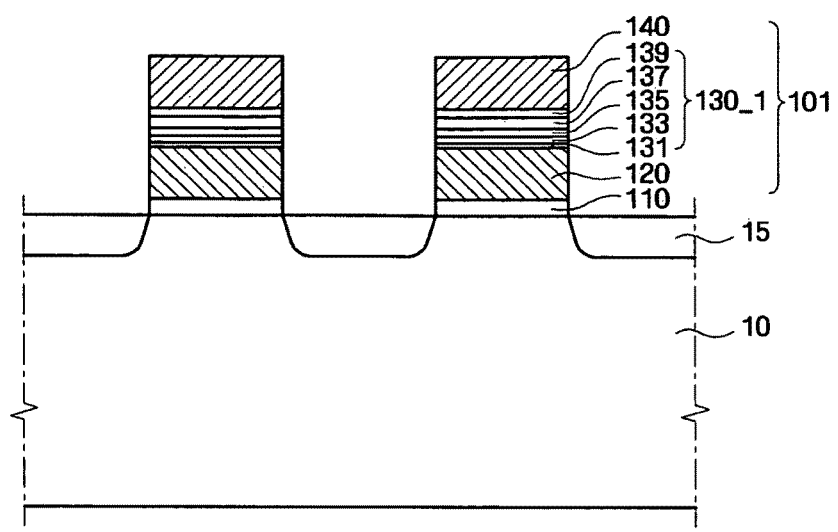
FIGS. 4A and 4B illustrate cross-sectional views of a memory device according to another embodiment.
Figure 4B:
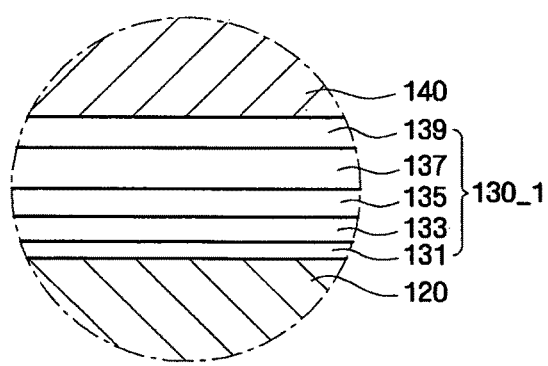

FIG. 4A illustrates a cross-sectional view of a non-volatile memory device according to another embodiment. FIG. 4B illustrates a detailed view of a blocking dielectric layer in FIG. 4A.

Referring to FIGS. 4A and 4B, the memory device according to another embodiment may be substantially the same as the memory device described previously with reference to FIGS. 1-3F, except for including a blocking dielectric layer 130_1 in a gate structure 101 having first to fifth dielectric layers 131, 133, 135, 137, and 139. Here, since the first to third dielectric layers 131 to 135 are substantially the same as described previously with reference to FIG. 1, a detailed description thereof will not be repeated.

As illustrated in FIGS. 4A-4B, the fourth dielectric layer 137 may be formed on the third dielectric layer 135, and may include aluminum silicate. The fourth dielectric layer 137 may be formed between the third dielectric layer 135 including aluminum oxide and the fifth dielectric layer 139 including silicon oxide, and may be substantially the same as the second dielectric layer 133 formed between the first dielectric layer 131 including silicon oxide and the third dielectric layer 135 including aluminum oxide. That is, Al/(Al+Si) of the fourth dielectric layer 137 may be about 60% to about 95%, e.g., about 70% to about 90%, in order for the fourth dielectric layer 137 to include mullite or crystallized mullite.

The fifth dielectric layer 139 may be formed on the fourth dielectric layer 137, and may include silicon oxide. The fifth dielectric layer 139 including the silicon oxide may have a high energy band gap against the electric charge, and thus, may efficiently prevent the electric charge from moving between the charge storage layer 120 and the upper electrode 140, thereby preventing or substantially minimizing leakage current. Also, the fifth dielectric layer 139 may prevent aluminum atoms included in the fourth dielectric layer 137 from diffusing into the upper electrode 140.

Figure 5:
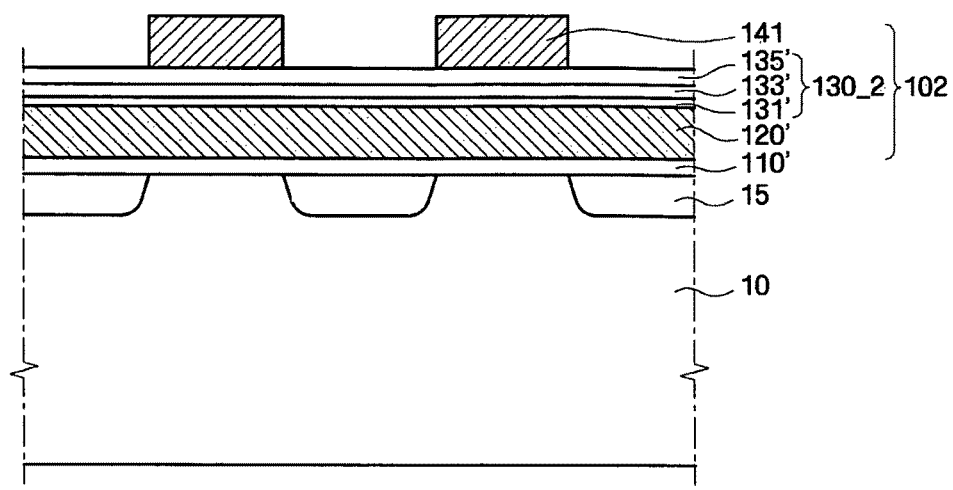
FIG. 5 illustrates a cross-sectional view of a memory device according to still another embodiment.

FIG. 5 illustrates a cross-sectional view of a non-volatile memory device according to still another embodiment. Referring to FIG. 5, the memory device may be a charge trap type flash memory device, and may be substantially the same as the memory device described previously with reference to FIGS. 1-3F, except that the tunneling dielectric layer 110', the charge storage layer 120', and the blocking dielectric layer 130_2 are not separated from each other.

In detail, in the memory device having a trap type flash memory device, unlike in the non-volatile memory device including a floating gate, the charge storage layer 120' may be made of a dielectric material, and thus, it may not be physically separated from a neighboring memory cell (or gate structure). Accordingly, the memory device in FIG. 5 may not include patterning of the tunnel dielectric layer 110', the charge storage layer 120', and the blocking dielectric layer 1302.

Although not illustrated in the drawing, in the memory device in FIG. 5, at least one of the tunneling dielectric layer, charge storage layer, and the tunneling dielectric layer may be patterned.

A more detailed description of example embodiments will be provided in the following experimental examples.

Experimental Example 1

A dielectric layer including aluminum silicate was formed on a silicon substrate by changing the $SiO_2/Al_2O_3$ process cycle ratio. Next, a TaN electrode was formed on the aluminum silicate layer, followed by a thermal treatment at 1080° C. Then, transmission electron microscope photographs were taken of the aluminum silicate layer, and electron energy loss spectroscopy (EELS) was measured. The $SiO_2/Al_2O_3$ process cycle ratio used when the dielectric layer was formed and Al/(Al+Si) in the dielectric layer formed accordingly are shown in FIG. 6. Also, schematic diagrams of the transmission electron microscope photographs taken in the $SiO_2/Al_2O_3$ process cycle ratio (A-D) are shown in FIGS. 7A, 8A, 9A, and 10A, and the EELS results are shown in FIGS. 7B, 8B, 9B, and 10B, respectively. In FIGS. 7B, 8B, 9B, and 10B, graphs I, II, III, and IV represent the relative density changes of Al, Si, N, and O, respectively.

Figure 7A:
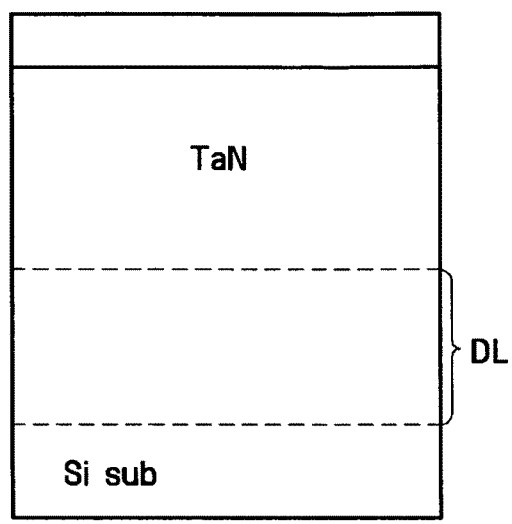
Figure 7B:
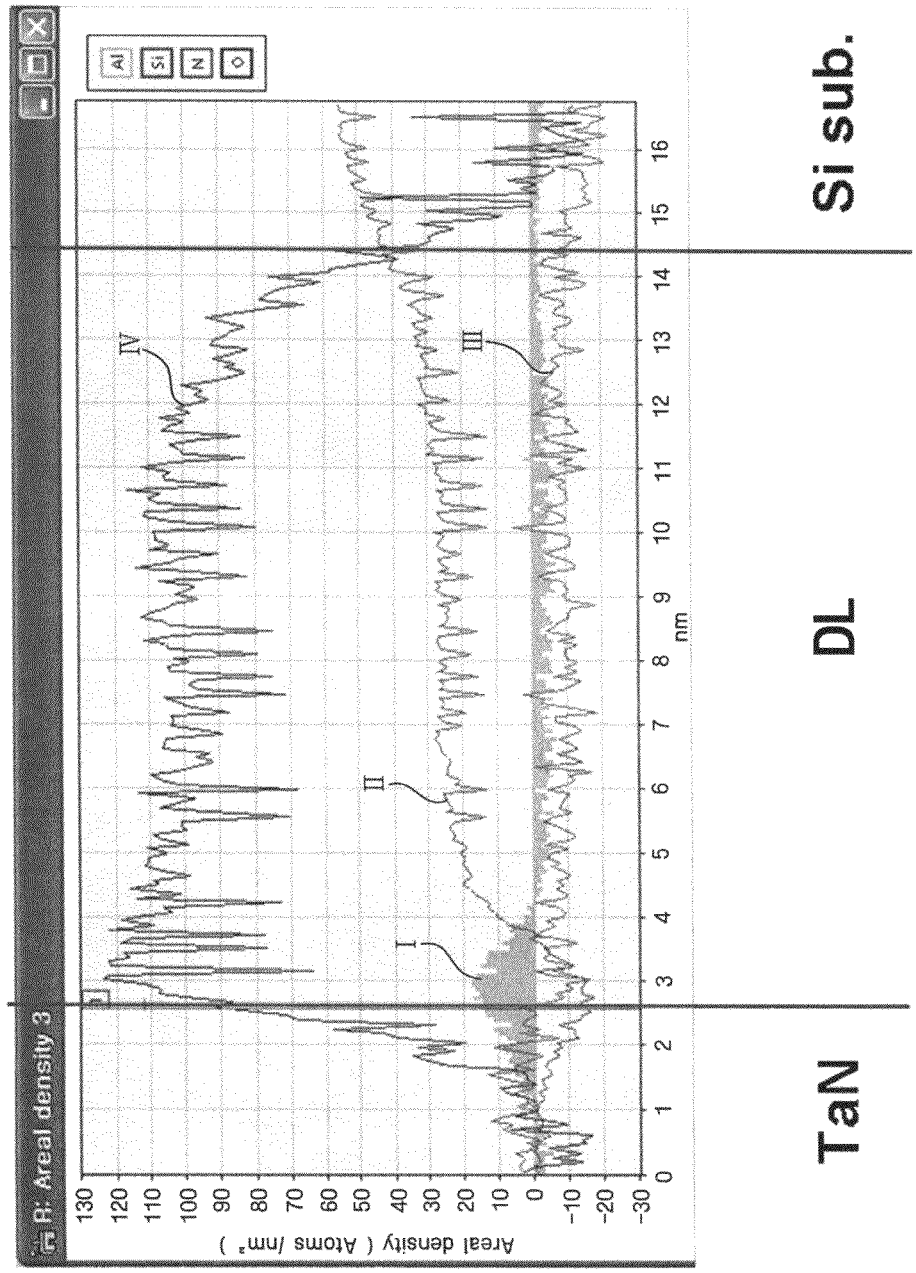

Referring to FIGS. 6, 7A, and 7B, if the $SiO_2/Al_2O_3$ process cycle ratio is 3:1 (see x-axis and reference numeral A in FIG. 6), it can be seen that the Al/(Al+Si) in the formed dielectric layer (DL) is about 40%, i.e., about 60% of $SiO_2$ in the y-axis of FIG. 6. If the above-described contents ratio is set, the dielectric layer (DL) is not crystallized (see DL in FIG. 7A that includes no crystallized portions), and a relatively large amount of the material forming the dielectric layer (DL) (e.g. $Al_2O_3$) is diffused to the TaN electrode (see FIG. 7B).

Figure 8A:
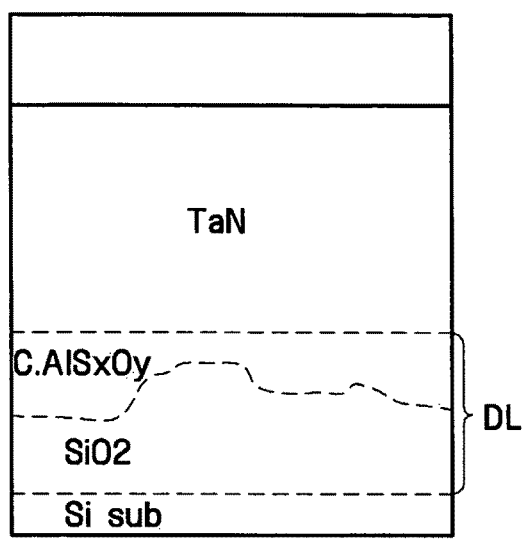
Figure 8B:
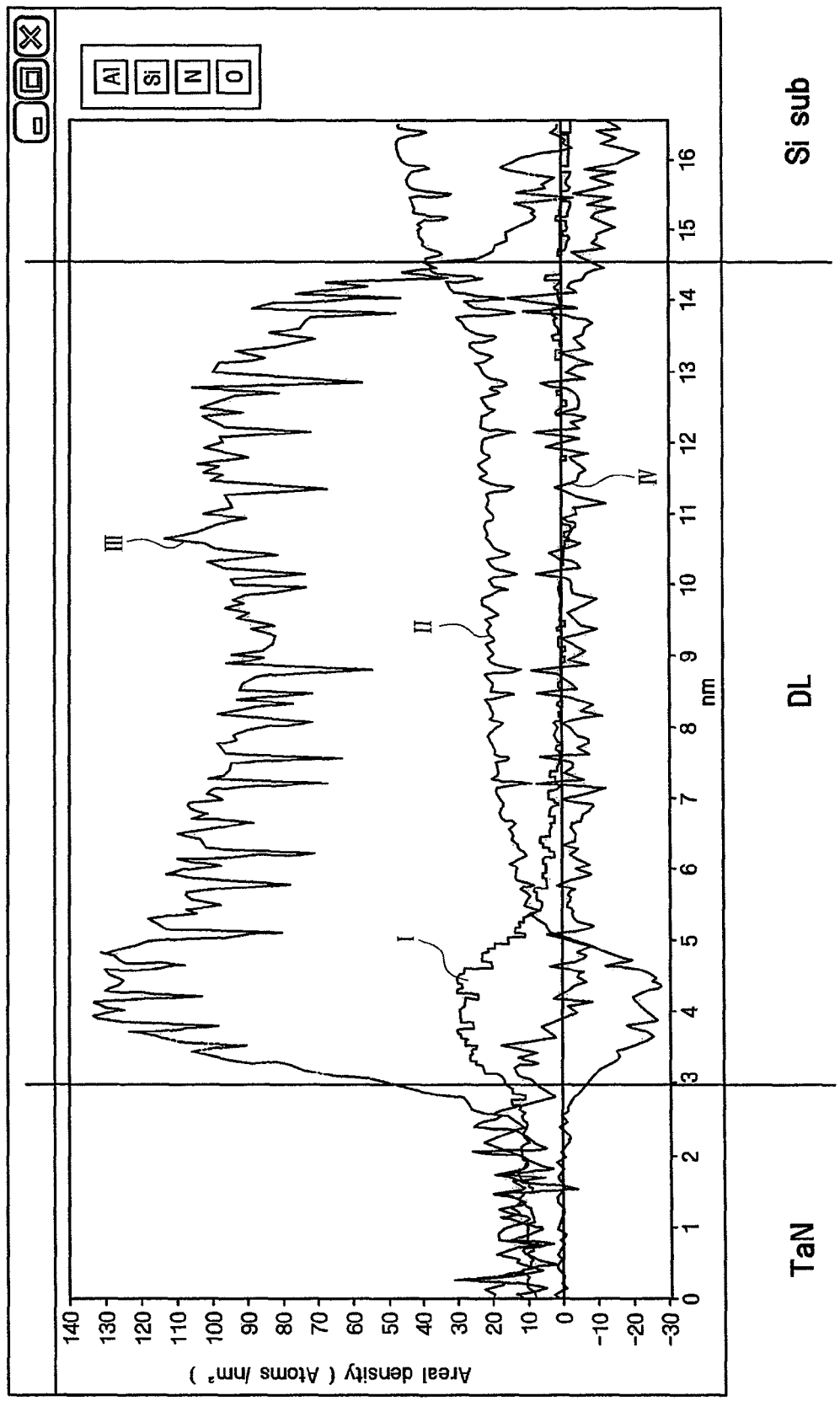

Referring to FIGS. 6, 8A, and 8B, if the $SiO_2/Al_2O_3$ process cycle ratio is 1:1 (see reference numeral B in FIG. 5), it can be seen that the Al/(Al+Si) in the formed dielectric layer (DL) is about 60%. If the above-described contents ratio is set, the crystallization of mullite may be not uniform (see C. $AlSi_xO_y$ in FIG. 8A that has a non-uniform thickness and structure) even if the dielectric layer (DL) partially includes crystallized mullite (C. $AlSi_xO_y$). Also, a relatively large amount of the material forming the dielectric layer (DL) (e.g. $Al_2O_3$) is diffused into the TaN electrode (see FIG. 8B).

Figure 9A:
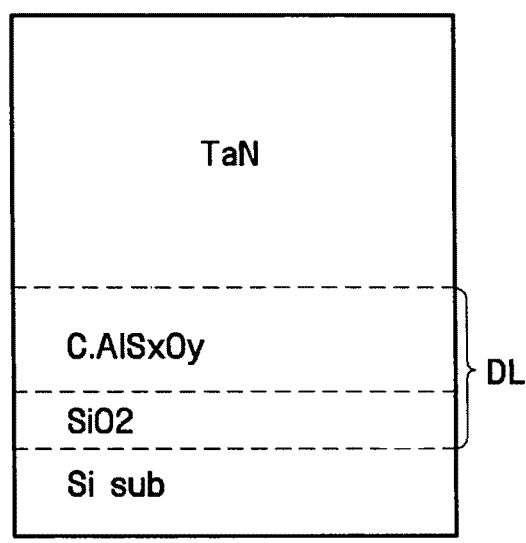
Figure 9B:
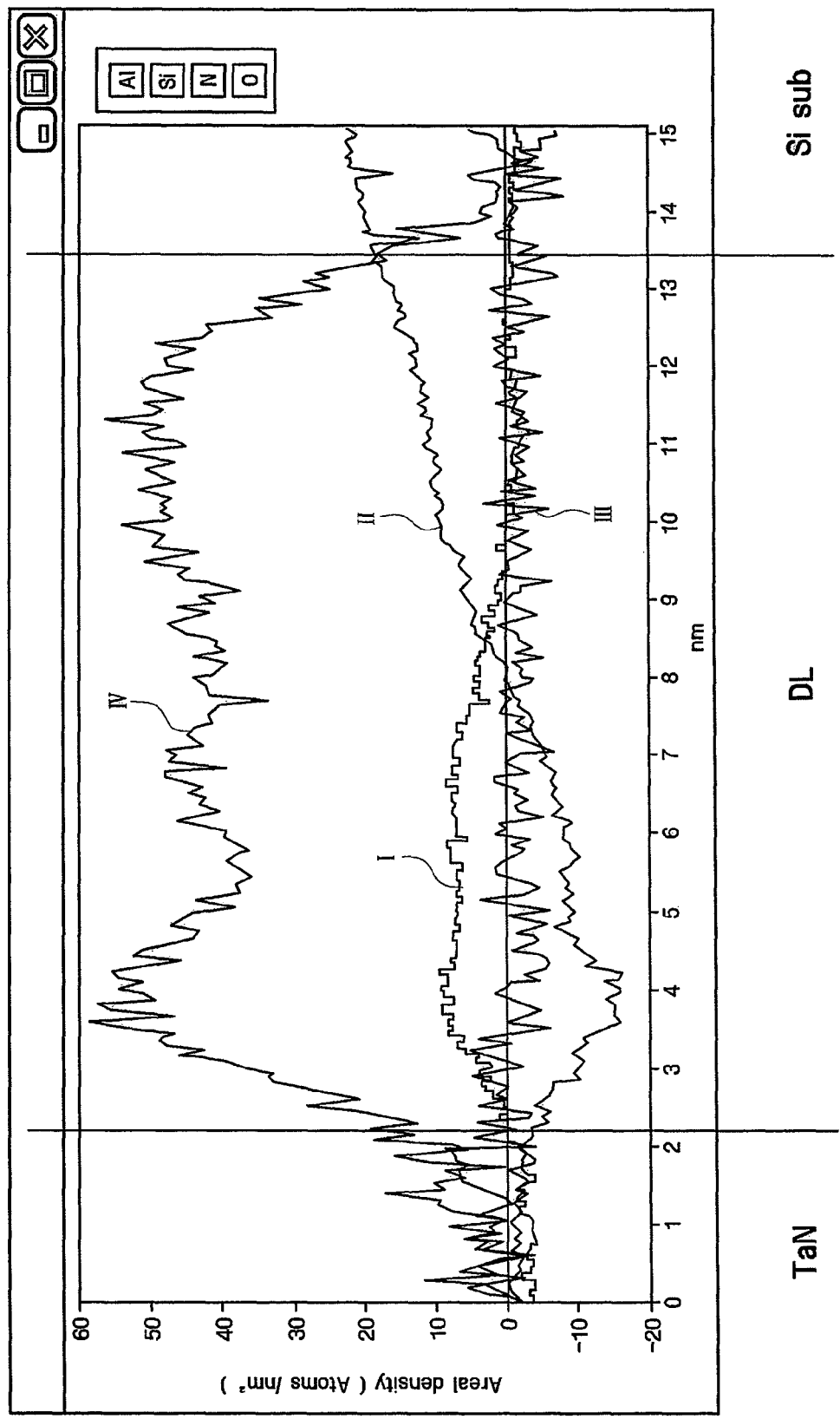

Referring to FIGS. 6, 9A, and 9B, if the $SiO_2/Al_2O_3$ process cycle ratio is 1:3 (see reference numeral C in FIG. 6), it can be seen that the Al/(Al+Si) in the formed dielectric layer (DL) is about 90%. If the above-described contents ratio is set, the dielectric layer (DL) includes a relatively uniform crystallization of mullite (see C. $AlSi_xO_y$ in FIG. 9A that has a substantially uniform thickness and structure) and the material forming the dielectric layer (DL) (e.g. $Al_2O_3$) is almost not diffused to the TaN electrode (see curve I representing Al in FIG. 9B).

Figure 10A:
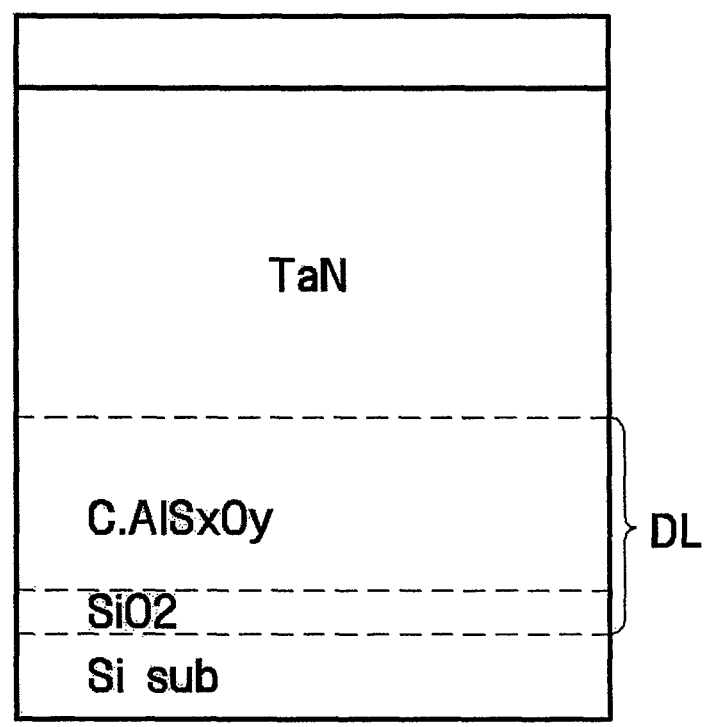
Figure 10B:
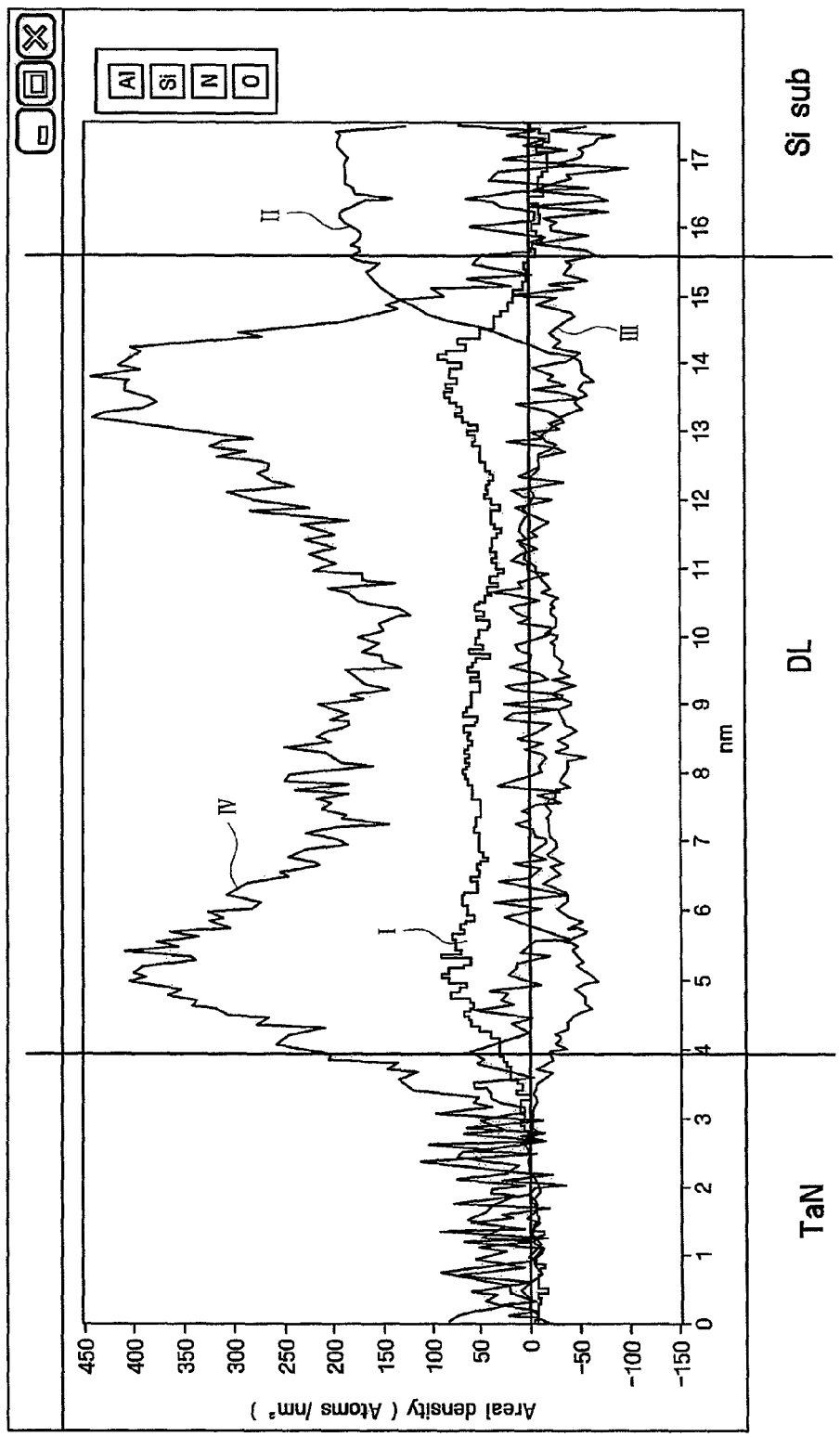

Referring to FIGS. 6, 10A, and 10B, if the $SiO_2/Al_2O_3$ process cycle ratio is 1:9 (see reference numeral D in FIG. 6), it can be seen that the Al/(Al+Si) in the formed dielectric layer (DL) is about 95%. If the above-described contents ratio is set, a relatively large amount of the material forming the dielectric layer (DL) (e.g. $Al_2O_3$) is (diffused to the TaN electrode (see FIG. 10B) even if the dielectric layer (DL) includes a relatively uniform crystallization of mullite (see FIG. 10A).

That is, if the $SiO_2/Al_2O_3$ process cycle ratio is adjusted and the Al/(Al+Si) in the formed dielectric layer (DL) is larger than 70% that is near the ideal mullite composition ratio ($3Al_2O_3.2SiO_2$) and is smaller than 90%, a relatively uniform crystallization of mullite may be formed. Further, diffusion of $Al_2O_3$ into the TaN electrode may be prevented or substantially minimized.

Experimental Example 2

A blocking dielectric layer according to example embodiments, i.e., an experimental layer in an experimental structure, was formed and compared to first to third comparative examples. Different dielectric layers were included between a lower electrode and an upper electrode, followed by diverse experiments. The lower electrode and the upper electrode were formed in the same manner, i.e., a p-type Si substrate and TaN upper electrode, and only the dielectric layers were formed in a different manner.

In the experimental structure, on the lower electrode, silicon oxide/aluminum silicate, i.e., mullite, were formed in lamination with respective thicknesses of 20/40 angstroms. Accordingly, the EOT of the multilayer dielectric layer formed was 57 angstroms.

In the first comparative example, silicon oxide/silicon nitride/silicon oxide were formed in lamination with respective thicknesses of 40 Å/60 Å/60 Å. Accordingly, the EOT of the multilayer dielectric layer was 141 angstroms.

In the second comparative example, aluminum oxide was formed with a thickness of 151 angstroms, and the EOT of the dielectric layer was 65 angstroms.

In the third comparative example, silicon oxide/aluminum oxide were formed in lamination with respective thicknesses of 70/50 angstroms. Accordingly, the EOT of the multilayer dielectric layer was 102 angstroms.

Figure 11:
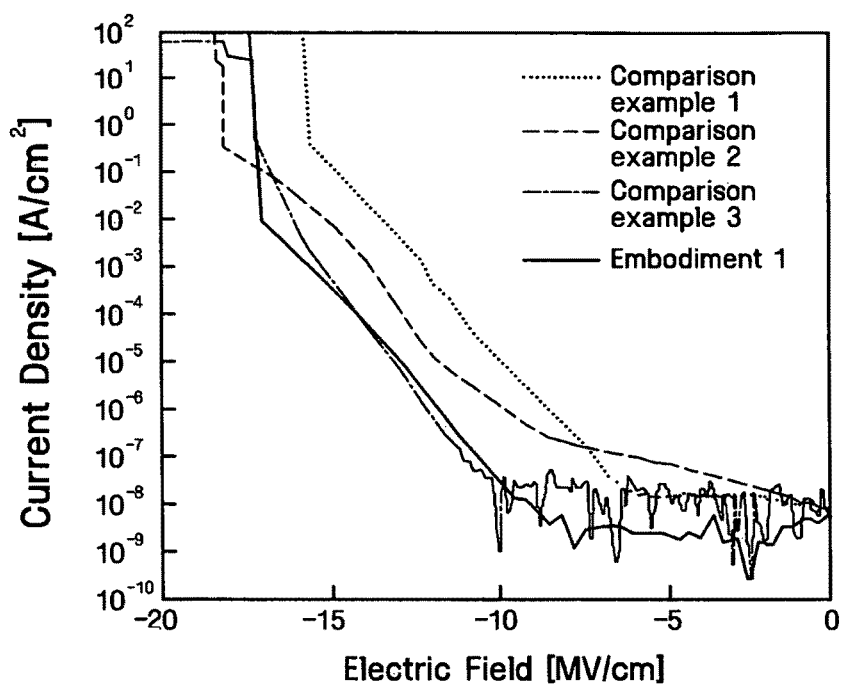

Thereafter, an electric field formed between the lower electrode and the upper electrode was changed, and leakage current was measured in the experimental structure and first to third comparative examples. The results of the measurements are illustrated in FIG. 11. In FIG. 11, x-axis represents the intensity of the electric field formed on both ends of the lower electrode and the upper electrode, and y-axis represents leakage current. As illustrated in FIG. 11, in the dielectric layer, i.e., silicon oxide/aluminum silicate, according to example embodiments, i.e., in the experimental structure, the leakage current was reduced although the physical thickness thereof was small in comparison to the comparative examples.

Experimental Example 3

A memory device having the structure illustrated in FIG. 1, i.e., an experimental structure, was compared to a fourth comparative example. In both structures, the tunnel dielectric layer was formed of silicon oxide with a thickness of 70 angstroms, the charge storage layer was formed of silicon nitride with a thickness of 70 angstroms, and the upper electrode was formed of TaN.

In the experimental structure, the blocking dielectric layer was formed by forming silicon oxide/aluminum silicate (mullite)/aluminum oxide with respective thicknesses of 20/35/50 angstroms, and the EOT of the structure was 160.1 angstroms.

By contrast, in the fourth comparative example, the blocking dielectric layer was formed by forming silicon oxide/aluminum oxide with respective thicknesses of 40/50 angstroms, and the EOT was 167.6 angstroms.

Thereafter, an operating voltage Vth of 5.5V during a program operation and an operating voltage Vth of (−0.5) V during an erase operation were applied to the upper electrode and measured. Results are reported in Table 1 below.

TABLE 1

|  | Vpgm @ Vth = 5.5 V | Vers @ Vth = (−0.5) V |
| --- | --- | --- |
| Experimental Structure | 21.8 V | (−18.9) V |
| Fourth Comparative Example | 22.5 V | (−20.2) V |

Referring to Table 1, in the Experimental Structure, an operating voltage of the memory device was reduced in comparison to the fourth comparative example.

Experimental Example 4

A memory device having a structure according to example embodiments, i.e., an Experimental Structure described in the Experimental Example 2, was compared to the fourth comparative example in terms of HTS (High Temperature Storage) characteristics.

Figure 12A:
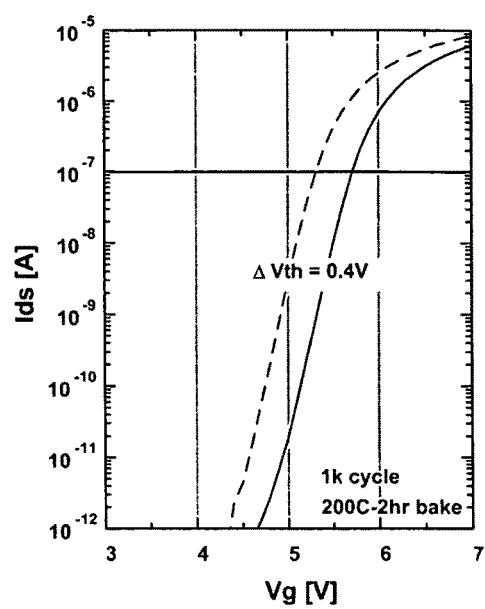
Figure 12B:
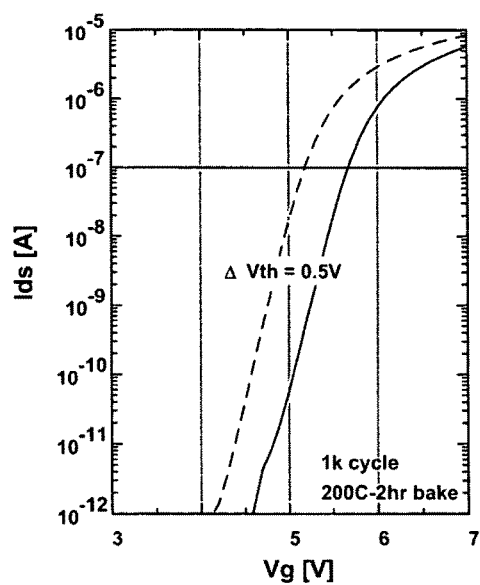

Specifically, in the Experimental Structure, a program operation, in which the threshold voltage Vth is 6V, and an erase operation, in which the threshold voltage Vth is 0V, were repeated for 1000 cycles, and the results were baked at 200° C. for two hours. Then, the change of the operating voltage Vth was measured by measuring the change of drain current in response to the change of voltage applied to the upper electrode before and after the baking process. The results of measurement are shown in FIGS. 12A and 12B. Also, the solid line in FIGS. 12A and 12B indicates the measurement before the baking process of the memory device, and the dotted line indicates the measurement after the baking process.

Referring to FIGS. 12A and 12B, it can be seen that in the Experimental Structure, i.e., that includes the aluminum silicate between the silicon oxide and the aluminum oxide, the difference of the operating voltage Vth (i.e. ΔVth) during the operation of the program before and after the baking process is improved by about 0.1 V, in comparison to the fourth comparative example. That is, in the Experimental Structure, the HTS characteristics (i.e. reliability) are improved, in comparison to the fourth comparative example.

Figure 13:
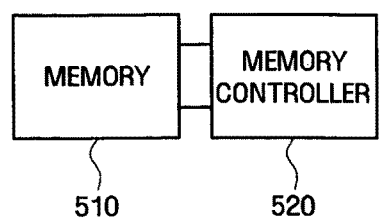
FIGS. 13 to 15 illustrate systems including a memory device according to embodiments.
Figure 14:
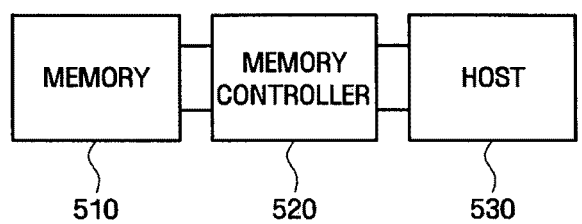
Figure 15:
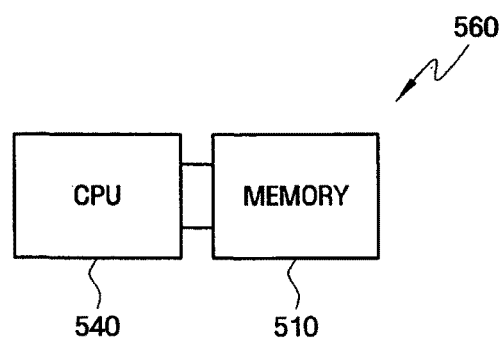

FIGS. 13 to 15 illustrate diagrams of a memory device fabricated according to embodiments.

Referring to FIG. 13, a system according to an embodiment may include a memory 510 and a memory control unit 520 connected to the memory 510. Here, the memory 510 is a memory formed according to an embodiment, i.e., that has a low operation voltage and an improved reliability as described above. The memory control unit 520 may provide input signals that correspond to the control of the operation of the memory 510, e.g., a command signal and an address signal for controlling a read operation and a write operation, to the memory 510.

The system including the memory 510 and the memory control unit 520 may be embodied in a card, e.g., a memory card. The system according to an embodiment may be embodied in a card that satisfies the specified industry standard used in an electronic device, e.g., a portable phone, a two-way communication system, a one-way pager, a two-way pager, a personal communication system, a portable computer, a personal data assistant (PDA), an audio and/or video player, a digital and/or video camera, a navigation system, a global positioning system (GPS), and the like. However, embodiments are not limited thereto, and the system according to an embodiment may be embodied in diverse forms, e.g., a memory stick or the like.

Referring to FIG. 14, a system according to another embodiment may include the memory 510, the memory control unit 520, and a host system 530. Here, the host system 530 may be connected to the memory control unit 520 through a bus, and may provide a control signal to the memory control unit 520 so that the memory control unit 520 controls the operation of the memory 520. The host system 530 may be a processing system that is used, e.g., in a portable phone, a two-way communication system, a one-way pager, a two-way pager, a personal communication system, a portable computer, a personal data assistant (PDA), an audio and/or video player, a digital and/or video camera, a navigation system, a global positioning system (GPS), and the like.

In FIG. 14, the memory control unit 520 may be interposed between the memory 510 and the host system 530. However, embodiments are not limited thereto, and in a system according to still another embodiment, the memory control unit 520 may be selectively omitted.

Referring to FIG. 15, the system according to still another embodiment may be a computer system 560 including a CPU (Central Processing Unit) 540 and the memory 510. In the computer system 560, the memory 510 may be directly connected to the CPU 540 or may be connected to the CPU using typical computer bus architecture. The memory 510 may store OS (Operation System), instruction set, BIOS (Basic Input/Output System) instruction, or the like, or may be used as a large-capacity storage device such as SSD (Solid State Disk).

It is noted that for convenience in explanation, not all elements included in the computer system 560 are illustrated in FIG. 15. Also, for convenience in explanation, the memory controller 520 between the memory 510 and the CPU 540 may be omitted in FIG. 15. However, in still another embodiment of the present invention, the memory controller 520 may be interposed between the memory 510 and the CPU 540.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A memory device, comprising:
a tunneling dielectric layer on a substrate;
a charge storage layer on the tunneling dielectric layer;
a blocking dielectric layer on the charge storage layer, the blocking dielectric layer including a first dielectric layer having silicon oxide, a second dielectric layer on the first dielectric layer and having crystallized aluminum silicate, and a third dielectric layer on the second dielectric layer and having aluminum oxide; and
an upper electrode on the blocking dielectric layer.

2. The memory device as claimed in claim 1, wherein the aluminum silicate in the second dielectric layer is mullite.

3. The memory device as claimed in claim 1, wherein the aluminum silicate in the second dielectric layer includes a phase of aluminum oxide and silicon oxide, a weight ratio of the aluminum oxide to a sum of the aluminum oxide and silicon oxide being about 60% to about 95%.

4. The memory device as claimed in claim 3, wherein the weight ratio of the aluminum oxide to the sum of the aluminum oxide and silicon oxide is about 70% to about 90%.

5. The memory device as claimed in claim 1, wherein the second dielectric layer is between the first dielectric layer and the third dielectric layer.

6. The memory device as claimed in claim 1, wherein a thickness of the second dielectric layer is equal to or larger than a thickness of the first dielectric layer.

7. The memory device as claimed in claim 6, wherein the second dielectric layer is thinner than the third dielectric layer.

8. The memory device as claimed in claim 2, wherein the crystallized aluminum silicate is mullite that exhibits substantially uniform crystallization in an entire thickness of the second dielectric layer.

9. The memory device as claimed in claim 1, wherein the charge storage layer includes one or more of silicon nitride, hafnium oxide, zirconium oxide, tantalum oxide, hafnium nitride oxide, hafnium silicon oxide, tungsten doped aluminum oxide, and nanodots.

10. A method of fabricating a memory device, comprising:
forming a tunneling dielectric layer on a substrate;
forming a charge storage layer on the tunneling dielectric layer;
forming a blocking dielectric layer on the charge storage layer, the blocking dielectric layer including a first dielectric layer having silicon oxide, a second dielectric layer on the first dielectric layer and having crystallized aluminum silicate, and a third dielectric layer on the second dielectric layer and having aluminum oxide; and
forming an upper electrode on the blocking dielectric layer.

11. The method as claimed in claim 10, wherein the second dielectric layer is formed using an atomic layer deposition (ALD) method.

12. The method as claimed in claim 11, wherein the second dielectric layer is formed by an in-situ process.

13. The method as claimed in claim 10, wherein the second dielectric layer is formed to have a weight ratio of aluminum oxide to aluminum silicate of about 70% to about 90%.

14. The method as claimed in claim 10, further comprising performing thermal treatment of the second dielectric layer at about 850° C. to about 1200° C.

15. The memory device as claimed in claim 1, wherein the first through third dielectric layers of the blocking dielectric layer are arranged in an increasing order of dielectric constant.

16. The memory device as claimed in claim 1, wherein the third dielectric layer of the first through third dielectric layers is closest to the upper electrode and has the highest dielectric constant of the first through third dielectric layers of the blocking dielectric layer.

17. A memory device, comprising:
a tunneling dielectric layer on a substrate;
a charge storage layer on the tunneling dielectric layer;
a blocking dielectric layer on the charge storage layer, the blocking dielectric layer including:
a first dielectric layer including silicon oxide,
a second dielectric layer on the first dielectric layer, the second dielectric layer including mullite and having a larger thickness than the first dielectric layer, and
a third dielectric layer on the second dielectric layer, the third dielectric layer including aluminum oxide and having a larger thickness than the second dielectric layer; and
an upper electrode on the blocking dielectric layer.

18. The memory device as claimed in claim 17, wherein the first dielectric layer is directly between the charge storage layer and the second dielectric layer, and the second dielectric layer is directly between the first and third dielectric layers.

19. The memory device as claimed in claim 17, wherein the second dielectric layer consists essentially of mullite.

* * * * *